(12) United States Patent
Guo

(10) Patent No.: US 11,217,608 B2
(45) Date of Patent: Jan. 4, 2022

(54) ARRAY SUBSTRATE AND MANUFACTURING METHOD THEREOF, AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Wenjun Guo, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 126 days.

(21) Appl. No.: 16/763,331

(22) PCT Filed: Mar. 26, 2020

(86) PCT No.: PCT/CN2020/081444
§ 371 (c)(1),
(2) Date: May 12, 2020

(87) PCT Pub. No.: WO2021/109370
PCT Pub. Date: Jun. 10, 2021

(65) Prior Publication Data
US 2021/0167093 A1   Jun. 3, 2021

(30) Foreign Application Priority Data

Dec. 2, 2019  (CN) .......................... 201911213389.7

(51) Int. Cl.
*H01L 27/118* (2006.01)
*H01L 27/12* (2006.01)
*G02F 1/1362* (2006.01)
*H01L 27/32* (2006.01)

(52) U.S. Cl.
CPC ...... *H01L 27/124* (2013.01); *G02F 1/136286* (2013.01); *H01L 27/1255* (2013.01); *H01L 27/3276* (2013.01)

(58) Field of Classification Search
CPC ............... H01L 27/124; H01L 27/1255; H01L 27/3276; G02F 1/136286
USPC ...................................... 257/40, 59, 72, 202
See application file for complete search history.

(56) References Cited

U.S. PATENT DOCUMENTS

2018/0275468 A1\*  9/2018  Hirosawa .......... G02F 1/133512

\* cited by examiner

*Primary Examiner* — Tan N Tran
(74) *Attorney, Agent, or Firm* — The Roy Gross Law Firm, LLC; Roy Gross

(57) ABSTRACT

The present invention provides an array substrate and a display panel. A second data line is disposed on the array substrate, so that a first data line is connected to the second data line. Therefore, after the first data line is disconnected, signals can be transmitted from the second data line, which solves a technical problem that current display panels cannot solve poor display caused by disconnection of the data lines.

12 Claims, 6 Drawing Sheets

ARRAY SUBSTRATE AND MANUFACTURING METHOD THEREOF, AND DISPLAY PANEL

FIELD OF INVENTION

The present disclosure relates to the field of display technology, and more particularly, to an array substrate and a display panel.

BACKGROUND OF INVENTION

Current display panels adopt a source/drain layer to form data lines. The data lines are unilateral input signal lines, and each of the signal lines transmits different signals, so that the data lines cannot be cross-linked to each other. After the signal lines are disconnected, it will cause a breaking point away from a signal input terminal to produce a bad bright line, which affects display.

Therefore, current display panels have a technical problem of not being able to solve poor display caused by disconnection of the data lines.

SUMMARY OF INVENTION

The present disclosure provides an array substrate and a display panel, which are used to solve the technical problem that current display panels cannot solve poor display caused by disconnection of the data lines.

In order to solve the above problems, technical solutions provided by the present disclosure is as follows:

The present disclosure provides an array substrate, and the array substrate comprises a substrate, a source/drain layer disposed at one side of the substrate. The source/drain layer is etched to form a first data line.

Wherein, the array substrate comprises a second data line, and a distance of a connecting hole between the first data line and the second data line is at least same as a length of one sub-pixel.

In the array substrate provided by the present disclosure, the array substrate further comprises a second metal layer and an interlayer insulating layer, the interlayer insulating layer is disposed between the second metal layer and the source/drain layer, the second metal layer is etched to form a second electrode plate of a capacitor and the second data line, a first through-hole is formed on the interlayer insulating layer, and the second data line is connected to the first data line through the first through-hole.

In the array substrate provided by the present disclosure, the array substrate further comprises an active layer, the source/drain layer is etched to form compensation signal lines, a direction of the compensation signal lines is same as a direction of the first data line, and the compensation signal lines are connected to the active layer through the connecting hole.

In the array substrate provided by the present disclosure, the interlayer insulating layer further comprises a second through-hole, the source/drain layer is etched to form power voltage lines, and adjacent columns of the power voltage lines are respectively connected to opposite sides of the second electrode plate through the second through-hole.

In the array substrate provided by the present disclosure, the array substrate further comprises a first metal layer, the first metal layer is etched to form scanning lines, a first electrode plate of the capacitor, and a compensation signal lines, and a direction of the scanning lines is same as a direction of the compensation signal lines.

In the array substrate provided by the present disclosure, the distance of an adjacent connecting hole between the first data line and the second data line is same as twice sum of the length of the sub-pixel and a distance between adjacent sub-pixels.

In the array substrate provided by the present disclosure, the distance of an adjacent connecting hole between the first data line and the second data line is same as a sum of the length of the sub-pixel and a distance between adjacent sub-pixels.

In the array substrate provided by the present disclosure, a projection of the first data line on the substrate overlaps a projection of the second data line on the substrate.

In the array substrate provided by the present disclosure, a projection of the second data line on the substrate is located at one side of a projection of the first data line on the substrate.

At the same time, the present disclosure provides a display panel, the display panel comprises an array substrate, and the array substrate comprises a substrate, a source/drain layer disposed at one side of the substrate. The source/drain layer is etched to form a first data line.

Wherein, the array substrate comprises a second data line, and a distance of a connecting hole between the first data line and the second data line is at least same as a length of one sub-pixel.

In the display panel provided by the present disclosure, the display panel comprises an organic light-emitting diode (OLED) display panel.

In the display panel provided by the present disclosure, the display panel comprises a liquid crystal display panel.

In the display panel provided by the present disclosure, the array substrate further comprises a second metal layer and an interlayer insulating layer, the interlayer insulating layer is disposed between the second metal layer and the source/drain layer, the second metal layer is etched to form a second electrode plate of a capacitor and the second data line, a first through-hole is formed on the interlayer insulating layer, and the second data line is connected to the first data line through the first through-hole.

In the display panel provided by the present disclosure, the array substrate further comprises an active layer, the source/drain layer is etched to form compensation signal lines, a direction of the compensation signal lines is same as a direction of the first data line, and the compensation signal lines are connected to the active layer through the connecting hole.

In the display panel provided by the present disclosure, the interlayer insulating layer further comprises a second through-hole, the source/drain layer is etched to form power voltage lines, and adjacent columns of the power voltage lines are respectively connected to opposite sides of the second electrode plate through the second through-hole.

In the display panel provided by the present disclosure, the array substrate further comprises a first metal layer, the first metal layer is etched to form scanning lines, a first electrode plate of the capacitor, and compensation signal lines, and a direction of the scanning lines is same as a direction of the compensation signal lines.

In the display panel provided by the present disclosure, the distance of an adjacent connecting hole between the first data line and the second data line is same as twice sum of the length of the sub-pixel and a distance between adjacent sub-pixels.

In the display panel provided by the present disclosure, the distance of an adjacent connecting hole between the first data line and the second data line is same as a sum of the length of the sub-pixel and a distance between adjacent sub-pixels.

In the display panel provided by the present disclosure, a projection of the first data line on the substrate overlaps a projection of the second data line on the substrate.

In the display panel provided by the present disclosure, a projection of the second data line on the substrate is located at one side of a projection of the first data line on the substrate.

The present disclosure provides an array substrate and a display panel. The array substrate comprises a substrate and a source/drain layer. The source/drain layer is disposed at one side of the substrate, and the source/drain layer is etched to form a first data line. Wherein, the array substrate further comprises a second data line, and a distance of a connecting hole between the first data line and the second data line is at least same as a length of one sub-pixel. The second data line is disposed on the array substrate, so that the first data line is connected to the second data line. Therefore, after the first data line is disconnected, signals can be transmitted from the second data line, which solves the technical problem that current display panels cannot solve poor display caused by disconnection of the data lines.

DETAILED DESCRIPTION OF PREFERRED EMBODIMENTS

The present disclosure provides an array substrate and a display panel, and in order to make purposes, technical solutions, and effect of the present disclosure clearer and more definite, the following describes the present disclosure in detail with reference to the drawings and examples. It should be understood that the specific embodiments described herein are only used to explain the present disclosure, and are not intended to limit the present disclosure.

The present disclosure is directed to the technical problem that current display panels cannot solve poor display caused by disconnection of the data lines, and embodiments of the present disclosure are used to solve the problem.

Figure 1:
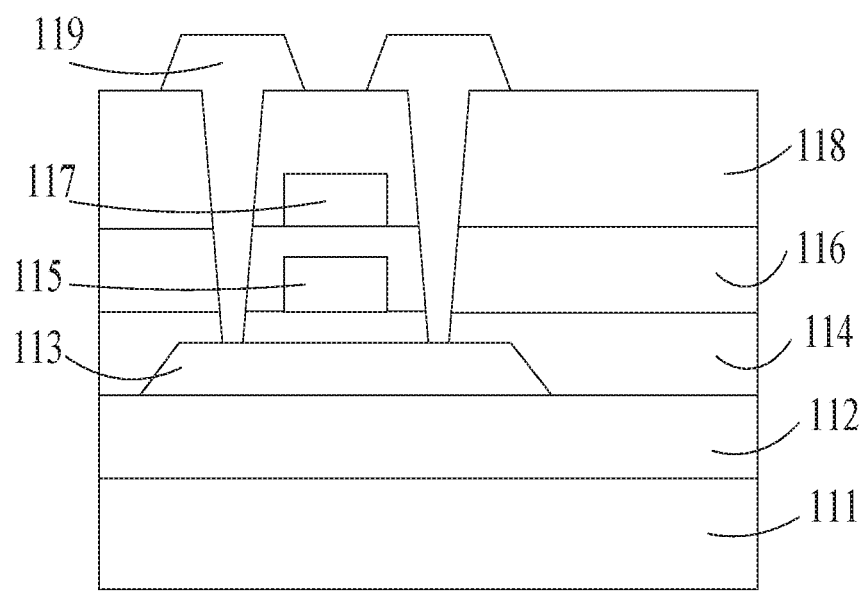
FIG. 1 is a first schematic diagram of an array substrate provided by an embodiment of the present disclosure.
Figure 3:
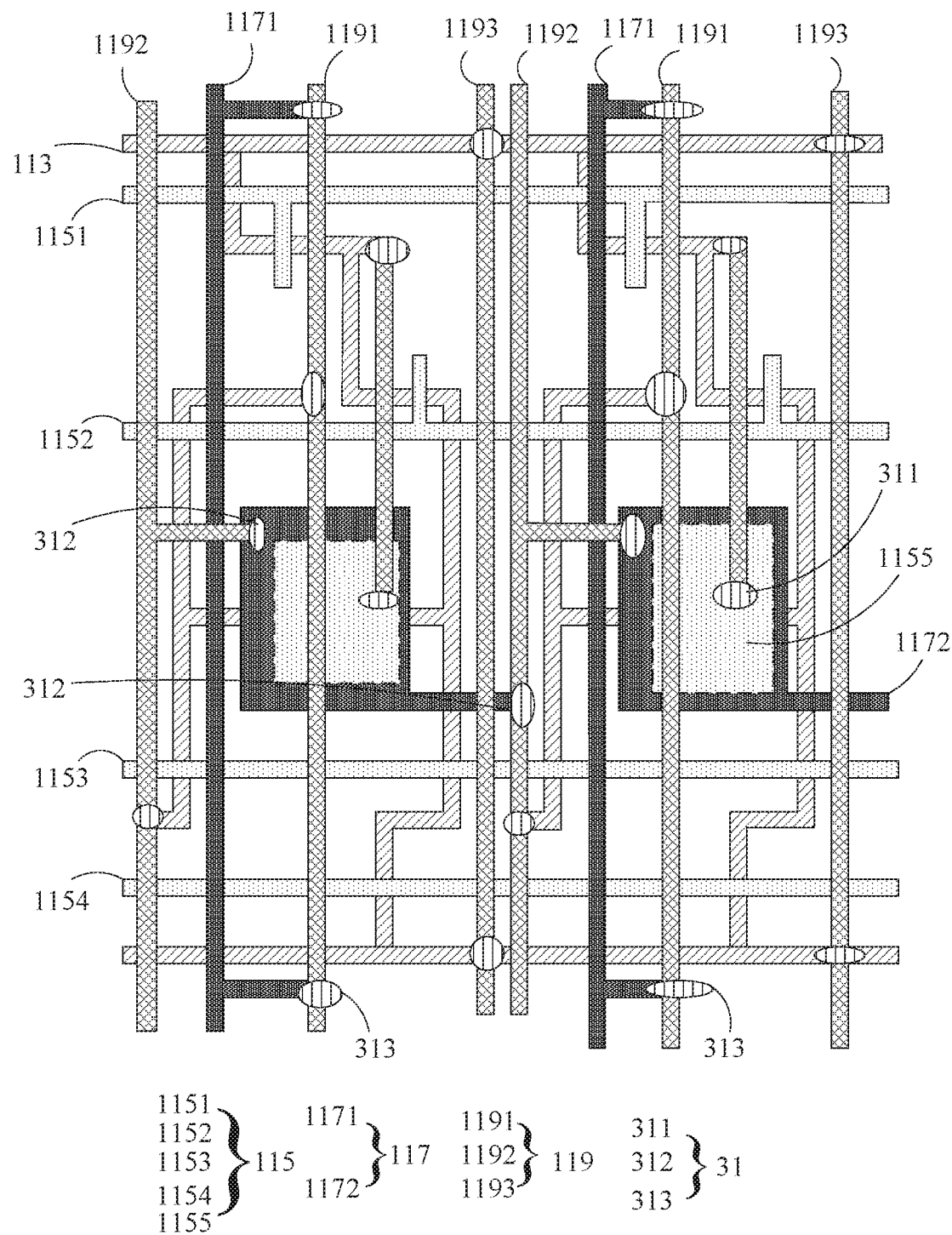
FIG. 3 is a third schematic diagram of the array substrate provided by the embodiment of the present disclosure.

As shown in FIG. 1 and FIG. 3, the present disclosure provides an array substrate. The array substrate comprises a substrate 111, a source/drain layer 119 disposed at one side of the substrate 111, and the source/drain layer 119 is etched to form a first data line 1191.

Wherein, the array substrate comprises a second data line 1171, and a distance of a connecting hole between the first data line 1191 and the second data line 1171 is at least same as a length of one sub-pixel.

An embodiment of the present disclosure provides an array substrate and a display panel. The array substrate comprises a substrate and a source/drain layer. The source/drain layer is disposed at one side of the substrate, and the source/drain layer is etched to form a first data line. Wherein, the array substrate further comprises a second data line, and a distance of a connecting hole between the first data line and the second data line is at least same as a length of one sub-pixel. The second data line is disposed on the array substrate, so that the first data line is connected to the second data line. Therefore, after the first data line is disconnected, signals can be transmitted from the second data line, which solves the technical problem that current display panels cannot solve poor display caused by disconnection of the data lines.

Figure 2:
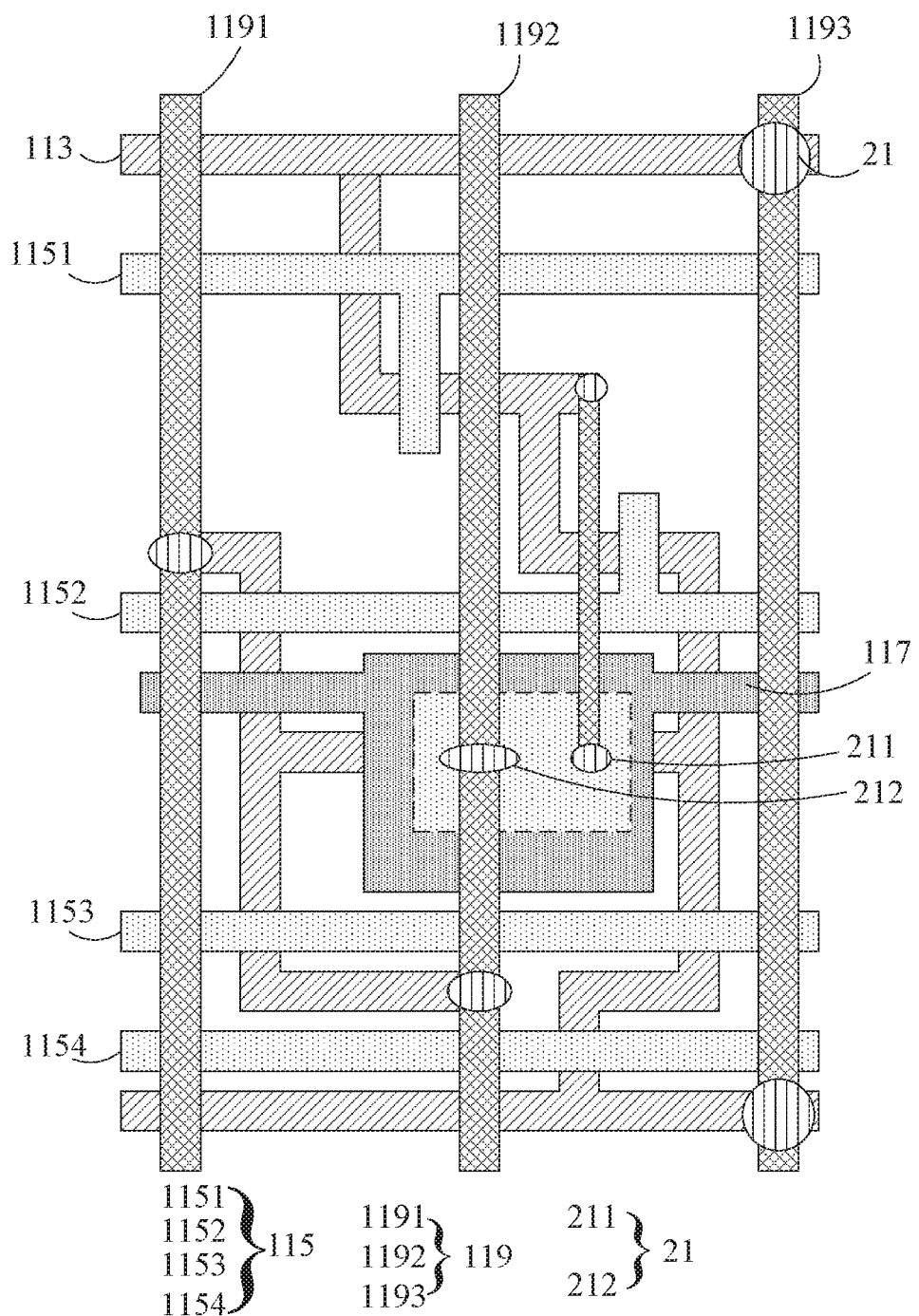
FIG. 2 is a second schematic diagram of the array substrate provided by the embodiment of the present disclosure.

In one embodiment, as shown in FIG. 1 and FIG. 2, the embodiment of the present disclosure provides an array substrate. The array substrate comprises a substrate 111, a barrier layer 112, an active layer 113, a first gate insulating layer 114, a first metal layer 115, a second gate insulating layer 116, a second metal layer 117, an interlayer insulating layer 118, and a source/drain layer 119, which are disposed in order. The first metal layer 115 is etched to form a first scanning line 1151, a second scanning line 1152, a third scanning line 1154, and alight-emitting signal line 1153. The source/drain layer 119 is etched to form a first data line 1191, power voltage lines 1192, and a compensation line 1193. In the current array substrate, horizontal compensation signal lines are formed by the second metal layer, so that the compensation signal lines transmit a compensation signal; however, in the embodiment of the present disclosure, the compensation signal lines are formed by the source/drain layer, so that the data lines may be formed on the second metal layer, which allow the data lines be cross-linked. As a result, after the data line is disconnected, a region where a breaking point is away from a signal input terminal will not cause poor display, thereby solving the technical problem that current display panels cannot solve poor display caused by disconnected data lines.

It should be noted that in FIG. 2, different film layers are connected through a connecting hole 21, and the connecting hole 21 comprises a first connecting hole 211 and a second connecting hole 212, wherein the first connecting hole 211 represent that a metal line of the source/drain layer is connected to a first electrode plate of a capacitor formed by the first metal layer 115 through the first connecting hole 211, and the second connecting hole 212 represent that the power voltage lines 1192 are connected to a second electrode plate of the capacitor formed by the second metal layer through the second connecting hole 212, and other connecting holes are connecting holes of the film layer corresponding to an overlapping region.

In one embodiment, as shown in FIG. 1 and FIG. 3, the array substrate further comprises the second metal layer 117 and the interlayer insulating layer 118. The interlayer insulating layer 118 is disposed between the second metal layer 117 and the source/drain layer 119, the second metal layer 117 is etched to form a second electrode plate 1172 of a capacitor and the second data line 1171, a first through-hole 313 is formed on the interlayer insulating layer 229, and the second data line 1171 is connected to the first data line 1191 through the first through-hole 313. The second metal layer is etched to form the second data line, and the second data line is connected to the first data line through the first through-hole, so that signals are transmitted on the first data line and the second data line. When the first data line is a disconnected, the signals can be transmitted along the second data line. Therefore, it is only necessary to cut off the breaking point so that the signals can continue to be transmitted, thereby preventing the breaking point away from the signal input terminal from generating bad display.

In should be noted that in FIG. 3, the connecting hole 31 comprises a first through-hole 313, a second through-hole 312, and a third connecting hole 311. The first through-hole 313 is a through-hole formed on the interlayer insulation layer, so that the first data line is connected to the second data line. The second through-hole 312 is a through-hole formed on the interlayer insulating layer, so that the power voltage lines are connected to the second electrode plate of the capacitor. The third connecting hole is a connecting hole of the first electrode plate of the capacitor formed by the metal line in the source/drain layer and the first metal layer. Other connecting holes are connecting holes of the film layer corresponding to an overlapping region.

In one embodiment, as shown in FIG. 3, the array substrate further comprises the active layer 113. The source/drain layer 119 is etched to form compensation signal lines 1193, a direction of the compensation signal lines 1193 is same as a direction of the first data line 1191, and the compensation signal lines 1193 are connected to the active layer through the connecting hole. After the second data line is disposed on the second metal layer, consideration that the compensation signal lines disposed on the second metal layer may cause short-circuiting between the second data line and the compensation signal lines, the compensation signal lines are disposed on the source/drain layer. Then, the compensation signal lines are connected to the active layer through the through-hole, so that the compensation signal lines compensate a circuit. When the second data line is disposed so that the first data line and the second data line are cross-linked, the compensation signal lines work normally. At the same time, because the power voltage lines are connected to the active layer, the power voltage lines and the compensation signal lines form a cross-linked signal line, so that when a problem occurs in the power voltage lines or a signal line in the compensation signal lines, the circuit can work normally, thereby displaying normally.

In one embodiment, as shown in FIG. 1 and FIG. 3, the interlayer insulating layer 118 further comprises the second through-hole 312. The source/drain layer 119 is etched to form power voltage lines 1192, and adjacent columns of the power voltage lines 1192 are respectively connected to opposite sides of the second electrode plate 1172 through the second through-hole 312. It can be seen from FIG. 3 that the power voltage lines in a first column on the left is connected to a left side of the second electrode plate in the first column on the left, the power voltage lines in a second column on the right are respectively connected to a right side of the second electrode plate in the first column on the left and a left side of the second electrode plate in the second column on the right, and the corresponding power voltage lines from a third column to the last column are connected to the second electrode plate of the capacitor, so that all power voltage lines are connected to the second electrode plate of the capacitor. The power voltage lines are connected to the second electrode plate by providing the second through-hole, so that the power voltage lines continue to be connected to the second electrode plate after the second data line separates from the second electrode plate. Therefore, an interaction occurs between the power voltage lines and the second plate interaction. As a result, when a short circuit occurs in a power voltage line, the power voltage lines can still work normally through interaction, and the second electrode plate can also work normally. When the second data line is disposed on the second metal layer to separate the second electrode plate of the capacitor, the second electrode plate can still be cross-linked, thereby preventing a problem with the single second electrode plate, which causes a greater impact on the circuit and makes the display normal.

In one embodiment, as shown in FIG. 3, the array substrate further comprises the first metal layer 115. The first metal layer 115 is etched to form the first scanning line 1151, the second scanning line 1152, the third scanning line 1154, the light-emitting signal line 1153, and the first electrode plate of the capacitor. The first scanning line, the second scanning line, and the third scanning line represent each level of scanning line; for example, the first scanning line represents a first level scanning line, the second scanning line represents a second level scanning line, and the third scanning line represents a third level scanning line.

In one embodiment, the array substrate comprises the first metal layer. The first metal layer is etched to form scanning lines, the first electrode plate of the capacitor, and the compensation signal lines, and a direction of the scanning lines is same as a direction of the compensation signal lines. Considering that the current compensation signal lines are laterally routed on the second metal layer, the compensation signal lines can be disposed on the first metal layer to allow the compensation signal lines to still be laterally routed, while the second data line is disposed on the second metal layer, so that the first data line and the second data line are cross-linked, thereby preventing poor display caused by disconnection of the first data line.

Figure 4:
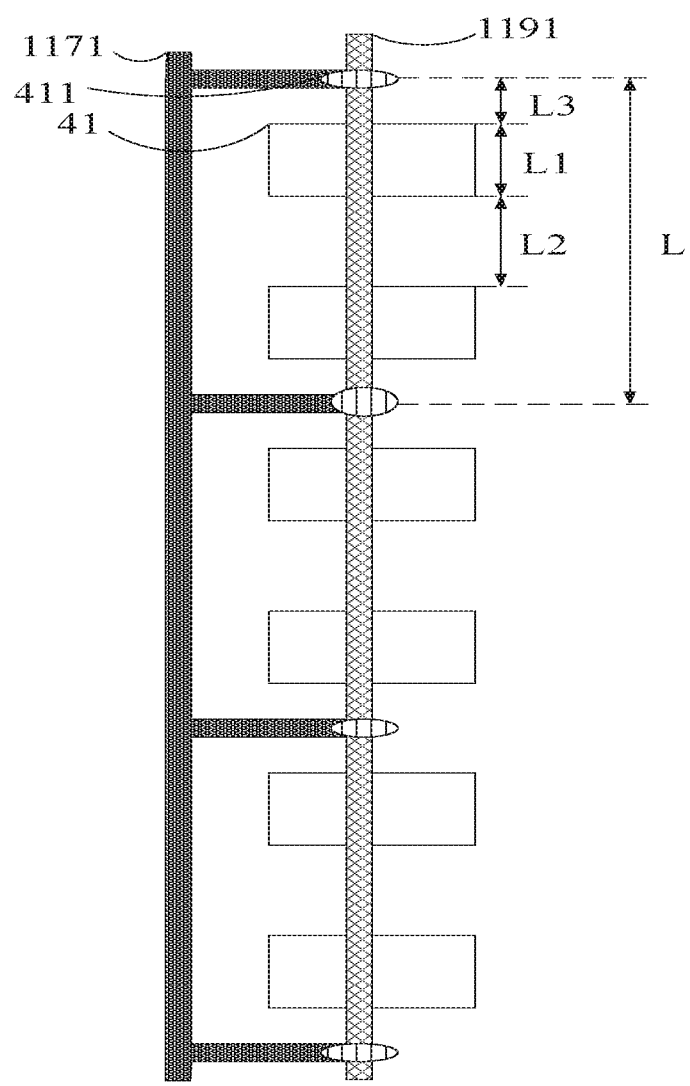
FIG. 4 is a first schematic diagram of a connection between a first data line and a second data line provided by the embodiment of the present disclosure.

In one embodiment, as shown in FIG. 4, the distance L of the adjacent connecting hole 411 between the first data line 1191 and the second data line 1171 is same as twice a sum of the length L1 of the sub-pixel and a distance L2 between adjacent sub-pixels 41, namely L=(L1+L2)*2, that is, when connecting holes are correspondingly defined, one connecting hole can be defined at an interval of two sub-pixels, so that when a problem with the sub-pixel occurs, it is sufficient to cut off the first data line in two sub-pixels between the connecting holes, so that a signal can continue to be transmitted backward, which allows the display panel to display normally.

Figure 5:
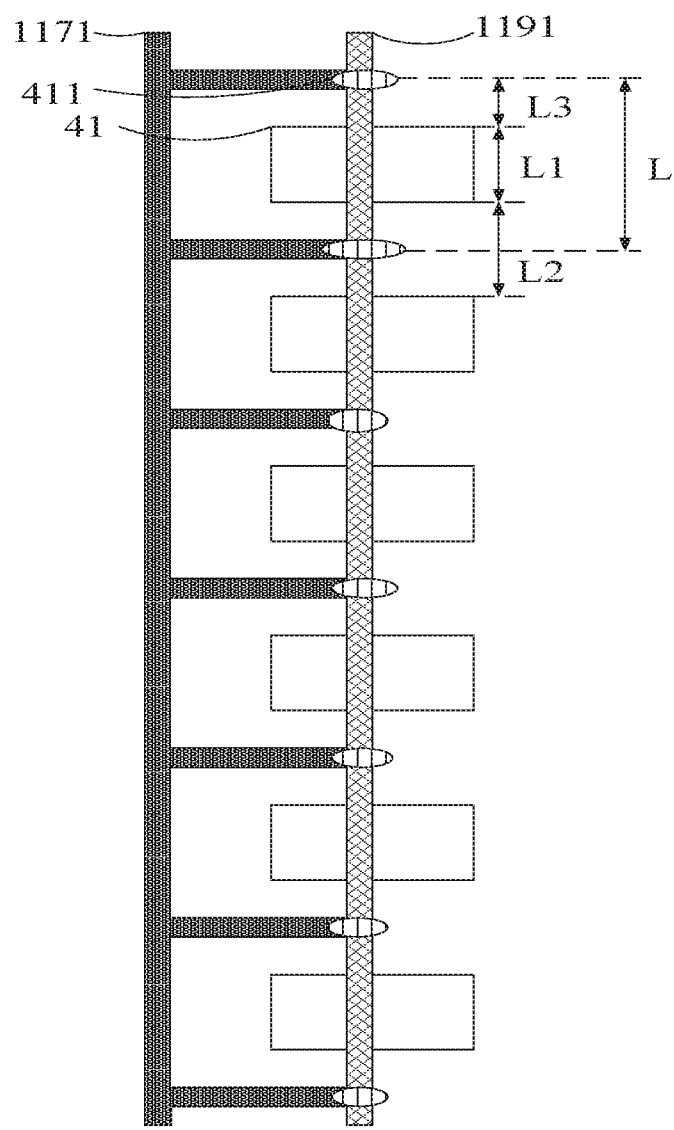
FIG. 5 is a second schematic diagram of the connection between the first data line and the second data line provided by the embodiment of the present disclosure.

In one embodiment, as shown in FIG. 5, the distance L of the adjacent connecting hole 411 between the first data line 1191 and the second data line 1171 is same as a sum of the length L1 of the sub-pixel and the distance L2 between adjacent sub-pixels, namely L=L1+L2, that is, when connecting holes are correspondingly defined, one connecting hole can be defined at an interval of one sub-pixel, so that when a problem with the sub-pixel occurs, it is sufficient to cut off the first data line in one sub-pixel between the connecting holes, so that an influence of disconnection on display effect is minimized, and only the sub-pixels at disconnecting position are needed to make the display work normally.

It should be noted that the connecting hole in FIG. 4 and FIG. 5 is the first through-hole in FIG. 3, and the connecting hole is provided at a midpoint between adjacent sub-pixels in FIG. 4 and FIG. 5, that is, L3 is same as one-half of L2.

In one embodiment, a projection of the first data line on the substrate overlaps a projection of the second data line on the substrate. When the second data line is disposed, the second data line can be disposed below the first data line. Therefore, when the first data line and the second data line are disposed, a disposing position of the first data line correspondingly overlaps a disposing position of the second data line. After the second data line is disposed, the first data line can be overlaid and disposed above the second data line without needing to take into account the position of the second data line, so that the first data line correspondingly overlaps the second data line.

In one embodiment, a projection of the second data line on the substrate is located at one side of a projection of the first data line on the substrate. As shown in FIG. 3, the projection of the second data line on the substrate does not overlap the projection of the first data line on the substrate. Even though the first data line and the second data line are staggered, when the first data line is disposed, the first data line is disposed according to a general disposing position, and the second data line is disposed in a region between the second plates of the capacitor, which allows the disposing position of the second data line to be confirmed, so that the second data line will not affect other lines when the second data line is disposed.

In the embodiment of the present disclosure, the first data line and the second data line are connected in parallel. In order to prevent a breaking point of the first data line from affecting display, the single data line is adopted in the prior art, and when the signal is transmitted on the data line, a larger pressure drop occurs due to larger impedance of the data line. However, in the embodiment of present disclosure, the first data line and the second data line are connected in parallel to reduce impedance of the data line, so that the pressure drop of the data line is reduced, thereby relieving the problem of pressure drop on the data line in the circuit.

In the embodiment of the present disclosure, when a breaking point on the first data line occurs, the breaking point is cut off so that both sides of the breaking point can display normally, which prevents all sub-pixels after the breaking point from being unable to display normally when the breaking point occurs on data lines in the current display panel and causing images of the display panel to be abnormal. In the embodiment of the present disclosure, the sub-pixels on both sides of the breaking point display normally, so that displayed images are normal.

Figure 6:
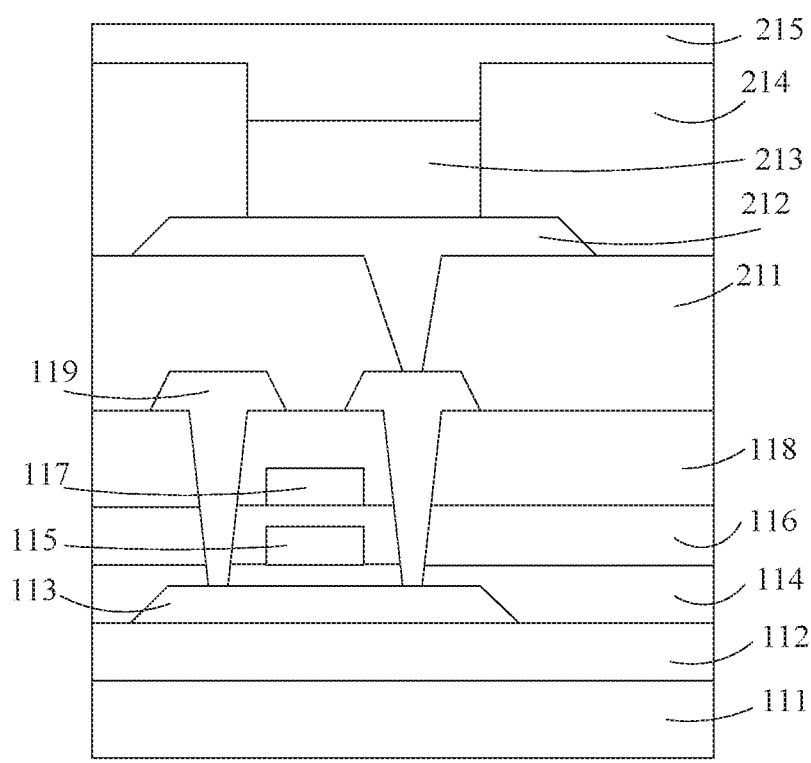
FIG. 6 is a schematic diagram of a display panel provided by the embodiment of the present disclosure.

As shown in FIG. 6, the embodiment of the present disclosure provides a display panel. The display panel comprises an array substrate, and the array substrate comprises a substrate 111 and a source/drain layer 119 disposed at one side of the substrate 111. The source/drain layer 119 is etched to form a first data line 1191.

Wherein, the array substrate comprises a second data line 1171, and a distance of a connecting hole between the first data line 1191 and the second data line 1171 is at least same as a length of one sub-pixel.

The embodiment of the present disclosure provides a display panel. The display panel comprises an array substrate. The array substrate comprises a substrate and a source/drain layer. The source/drain layer is disposed at one side of the substrate, and the source/drain layer is etched to form a first data line. Wherein, the array substrate further comprises a second data line, and a distance of a connecting hole between the first data line and the second data line is at least same as a length of one sub-pixel. The second data line is disposed on the array substrate, so that the first data line is connected to the second data line. Therefore, after the first data line is disconnected, signals can be transmitted from the second data line, which solves the technical problem that current display panels cannot solve poor display caused by disconnection of the data lines.

In one embodiment, as shown in FIG. 6, the display panel comprises an organic light-emitting layer diode (OLED) display panel. The OLED display panel comprises an array substrate, a planarization layer 211 disposed on the array substrate, a pixel electrode layer 212 disposed the planarization layer, a pixel definition layer 214 disposed on the pixel electrode layer, a luminescent material layer 213 disposed in a light-emitting region of a position defined by the pixel definition layer 214, and a common electrode layer 215 disposed on the pixel definition layer 214. In the OLED display panel, the array substrate adopts low temperature polysilicon array substrate. In the low temperature polysilicon array substrate, uniformity of all polysilicon semiconductors cannot be guaranteed, which causes threshold voltage drift and affects display effect. Therefore, compensation circuit is adopted to compensate influence of threshold voltage drift, but disconnection of data lines in the circuit has a greater impact on the display effect. Meanwhile, in the embodiment of the present disclosure, by disposing the first data line and the second data line so that the first data line and the second data line are cross-linked, a larger impact on the display panel when the first data line disconnects is prevented, so that the OLED display panel displays normally.

In one embodiment, the display panel comprises a liquid crystal display panel. The liquid crystal display panel comprises an array substrate, a color film substrate, and liquid crystals disposed between the array substrate and the color film substrate. A first data line and a second data line are disposed in the array substrate, so that when the data line is disconnected in the liquid crystal display panel, the liquid crystal display panel can still display normally, which solves the technical problem that current display panels cannot solve poor display caused by disconnection of the data lines.

In one embodiment, in the display panel, the array substrate further comprises a second metal layer and an interlayer insulating layer. The interlayer insulating layer is disposed between the second metal layer and the source/drain layer, the second metal layer is etched to form a second electrode plate of a capacitor and the second data line, a first through-hole is formed on the interlayer insulating layer, and the second data line is connected to the first data line through the first through-hole.

In one embodiment, in the display panel, the array substrate further comprises an active layer. The source/drain layer is etched to form compensation signal lines, a direction of the compensation signal lines is same as a direction of the first data line, and the compensation signal lines are connected to the active layer through the connecting hole.

In one embodiment, in the display panel, the interlayer insulating layer further comprises a second through-hole. The source/drain layer is etched to form power voltage lines, and adjacent columns of the power voltage lines are respectively connected to opposite sides of the second electrode plate through the second through-hole.

In one embodiment, in the display panel, the array substrate further comprises a first metal layer. The first metal layer is etched to form scanning lines, a first electrode plate of the capacitor, and compensation signal lines, and a direction of the scanning lines is same as a direction of the compensation signal lines.

In one embodiment, in the display panel, the distance of an adjacent connecting hole between the first data line and the second data line is same as twice a sum of the length of the sub-pixel and a distance between adjacent sub-pixels.

In one embodiment, in the display panel, the distance of an adjacent connecting hole between the first data line and the second data line is same as a sum of the length of the sub-pixel and a distance between adjacent sub-pixels.

In one embodiment, in the display panel, a projection of the first data line on the substrate overlaps a projection of the second data line on the substrate.

In one embodiment, in the display panel, a projection of the second data line on the substrate is located at one side of a projection of the first data line on the substrate.

The embodiment of the present disclosure provides an array substrate and a display panel. The array substrate comprises a substrate and a source/drain layer. The source/drain layer is disposed at one side of the substrate, and the source/drain layer is etched to form a first data line. Wherein, the array substrate further comprises a second data line, and a distance of a connecting hole between the first data line and the second data line is at least same as a length of one sub-pixel. The second data line is disposed on the array substrate, so that the first data line is connected to the second data line. Therefore, after the first data line is disconnected, signals can be transmitted from the second data line, which solves the technical problem that current display panels cannot solve poor display caused by disconnection of the data lines.

It should be understood that for those of ordinary skill in the art, equivalent replacements or changes can be made according to the technical solutions of the present disclosure and its inventive concept, and all these changes or replacements should fall within the protection scope of the claims attached to the present disclosure.

What is claimed is:

1. An array substrate, comprising:
    a substrate; and
    a source/drain layer disposed at one side of the substrate, wherein the source/drain layer is etched to form a first data line; and
    wherein the array substrate comprises a second data line, and a distance between connecting holes of the first data line and the second data line is at least same as a length of one sub-pixel, wherein the array substrate comprises a first metal layer, a second metal layer, and an interlayer insulating layer; the interlayer insulating layer is disposed between the second metal layer and the source/drain layer, the second metal layer is etched to form a second electrode plate of a capacitor and the second data line, a first through-hole is formed on the interlayer insulating layer, and the second data line is connected to the first data line through the first through-hole, wherein the array substrate comprises an active layer, the source/drain layer is etched to form compensation signal lines, a direction of the compensation signal lines is same as a direction of the first data line, and the compensation signal lines are connected to the active layer through the connecting hole, wherein the interlayer insulating layer comprises a second through-hole, the source/drain layer is etched to form power voltage lines, and adjacent columns of the power voltage lines are respectively connected to opposite sides of the second electrode plate through the second through-hole, wherein the first metal layer is etched to form scanning lines, a first electrode plate of the capacitor, and other compensation signal lines, and a direction of the scanning lines is same as a direction of the other compensation signal lines.

2. The array substrate as claimed in claim 1, wherein a distance of adjacent connecting holes between the first data line and the second data line is same as twice of a sum of a length of the sub-pixel and a distance between adjacent sub-pixels.

3. The array substrate as claimed in in claim 1, wherein a distance of adjacent connecting holes between the first data line and the second data line is same as a sum of a length of the sub-pixel and a distance between adjacent sub-pixels.

4. The array substrate as claimed in claim 1, wherein a projection of the first data line on the substrate overlaps a projection of the second data line on the substrate.

5. The array substrate as claimed in claim 1, wherein a projection of the second data line on the substrate is located at one side of a projection of the first data line on the substrate.

6. A display panel, comprising an array substrate, wherein the array substrate comprises:
    a substrate; and
    a source/drain layer disposed at one side of the substrate, wherein the source/drain layer is etched to form a first data line; and
    wherein the array substrate comprises a second data line, and a distance between connecting holes of the first data line and the second data line is at least same as a length of one sub-pixel, wherein the array substrate comprises a first metal layer, a second metal layer, and an interlayer insulating layer; the interlayer insulating layer is disposed between the second metal layer and the source/drain layer, the second metal layer is etched to form a second electrode plate of a capacitor and the second data line, a first through-hole is formed on the interlayer insulating layer, and the second data line is connected to the first data line through the first through-hole, wherein the array substrate comprises an active layer, the source/drain layer is etched to form compensation signal lines, a direction of the compensation signal lines is same as a direction of the first data line, and the compensation signal lines are connected to the active layer through the connecting hole, wherein the interlayer insulating layer comprises a second through-hole, the source/drain layer is etched to form power voltage lines, and adjacent columns of the power voltage lines are respectively connected to opposite sides of the second electrode plate through the second through-hole, wherein the first metal layer is etched to form scanning lines, a first electrode plate of the capacitor, and other compensation signal lines, and a direction of the scanning lines is same as a direction of the other compensation signal lines.

7. The display panel as claimed in claim 6, wherein the display panel comprises an organic light-emitting layer diode (OLED) display panel.

8. The display panel as claimed in claim 6, wherein the display panel comprises a liquid crystal display panel.

9. The display panel as claimed in claim 6, wherein a distance of adjacent connecting holes between the first data line and the second data line is same as twice of a sum of a length of the sub-pixel and a distance between adjacent sub-pixels.

10. The display panel as claimed in claim 6, a distance of adjacent connecting holes between the first data line and the second data line is same as a sum of a length of the sub-pixel and a distance between adjacent sub-pixels.

11. The display panel as claimed in claim 6, wherein a projection of the first data line on the substrate overlaps a projection of the second data line on the substrate.

12. The display panel as claimed in claim 6, wherein a projection of the second data line on the substrate is located at one side of a projection of the first data line on the substrate.

* * * * *